United States Patent
Duan et al.

(10) Patent No.: US 11,732,374 B2
(45) Date of Patent: Aug. 22, 2023

(54) REACTION PRODUCTS OF AMINE MONOMERS AND POLYMERS CONTAINING SATURATED HETEROCYCLIC MOIETIES AS ADDITIVES FOR ELECTROPLATING BATHS

(71) Applicants: Dow Global Technologies LLC, Midland, MI (US); Rohm and Haas Electronic Materials LLC, Marlborough, MA (US)

(72) Inventors: Lingli Duan, Shanghai (CN); Chen Chen, Shanghai (CN); Tong Sun, Shanghai (CN); Zukhra I. Niazimbetova, Westborough, MA (US); Maria Anna Rzeznik, Shrewsbury, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 630 days.

(21) Appl. No.: 16/745,544

(22) Filed: Jan. 17, 2020

(65) Prior Publication Data
US 2020/0149175 A1     May 14, 2020

Related U.S. Application Data

(62) Division of application No. 15/560,228, filed as application No. PCT/CN2015/077683 on Apr. 28, 2015, now Pat. No. 10,604,856.

(51) Int. Cl.
| | |
|---|---|
| *C25D 3/32* | (2006.01) |
| *C25D 3/38* | (2006.01) |
| *C08G 73/10* | (2006.01) |
| *C08G 73/00* | (2006.01) |
| *C25D 3/30* | (2006.01) |
| *C25D 7/00* | (2006.01) |
| *C08K 5/17* | (2006.01) |
| *H05K 3/24* | (2006.01) |

(52) U.S. Cl.
CPC ............. *C25D 3/32* (2013.01); *C08G 73/00* (2013.01); *C08G 73/1017* (2013.01); *C08G 73/1092* (2013.01); *C08K 5/17* (2013.01); *C25D 3/30* (2013.01); *C25D 3/38* (2013.01); *C25D 7/00* (2013.01); *H05K 3/241* (2013.01)

(58) Field of Classification Search
None
See application file for complete search history.

(56) References Cited

U.S. PATENT DOCUMENTS

| | | | |
|---|---|---|---|
| 3,846,380 A | 11/1974 | Fujimoto et al. | |
| 5,686,006 A | 11/1997 | Gaspard | |
| 5,686,066 A | 11/1997 | Harada et al. | |
| 5,961,965 A | 10/1999 | Kim et al. | |

FOREIGN PATENT DOCUMENTS

EP    0767191 A2 * 4/1997

OTHER PUBLICATIONS

International search report for corresponding International Application No. PCT/CN2015/077683 dated Sep. 11, 2015.
Search report for corresponding China Application No. 201580078476.X dated Jun. 29, 2019.

* cited by examiner

*Primary Examiner* — Jeffrey D Washville
(74) *Attorney, Agent, or Firm* — John J. Piskorski

(57) ABSTRACT

Reaction products of amines and polymers containing saturated heterocyclic moieties may be used as levelers in metal electroplating baths. The reaction products may plate metal with good surface properties and good physical reliability.

2 Claims, No Drawings

REACTION PRODUCTS OF AMINE MONOMERS AND POLYMERS CONTAINING SATURATED HETEROCYCLIC MOIETIES AS ADDITIVES FOR ELECTROPLATING BATHS

The present application is a divisional application of co-pending application Ser. No. 15/560,228, filed Sep. 21, 2017.

FIELD OF THE INVENTION

The present invention is directed to reaction products of amine monomers and polymers containing saturated heterocyclic moieties as additives for electroplating baths. More specifically, the present invention is directed to reaction products of amine monomers and polymers containing saturated heterocyclic moieties for electroplating baths which may be used as levelers in electroplating baths to provide good throwing power.

BACKGROUND OF THE INVENTION

Methods for electroplating articles with metal coatings generally involve passing a current between two electrodes in a plating solution where one of the electrodes is the article to be plated. A typical acid copper plating solution includes dissolved copper, usually copper sulfate, an acid electrolyte such as sulfuric acid in an amount sufficient to impart conductivity to the bath, a source of halide, and proprietary additives to improve the uniformity of the plating and the quality of the metal deposit. Such additives include levelers, accelerators and suppressors, among others.

Electrolytic copper plating solutions are used in a variety of industrial applications, such as decorative and anticorrosion coatings, as well as in the electronics industry, particularly for the fabrication of printed circuit boards and semiconductors. For circuit board fabrication, typically, copper is electroplated over selected portions of the surface of a printed circuit board, into blind vias and trenches and on the walls of through-holes passing between the surfaces of the circuit board base material. The exposed surfaces of blind vias, trenches and through-holes, i.e. the walls and the floor, are first made conductive, such as by electroless metallization, before copper is electroplated on surfaces of these apertures. Plated through-holes provide a conductive pathway from one board surface to the other. Vias and trenches provide conductive pathways between circuit board inner layers. For semiconductor fabrication, copper is electroplated over a surface of a wafer containing a variety of features such as vias, trenches or combinations thereof. The vias and trenches are metallized to provide conductivity between various layers of the semiconductor device.

It is well known in certain areas of plating, such as in electroplating of printed circuit boards ("PCBs"), that the use of levelers in the electroplating bath can be crucial in achieving a uniform metal deposit on a substrate surface. Electroplating a substrate having irregular topography can pose difficulties. During electroplating a voltage drop typically occurs within apertures in a surface, which can result in an uneven metal deposit between the surface and the apertures. Electroplating irregularities are exacerbated where the voltage drop is relatively extreme, that is, where the apertures are narrow and tall. Consequently, depositing a metal layer of substantially uniform thickness is frequently a challenging step in the manufacture of electronic devices.

Leveling agents are often used in copper plating baths to provide substantially uniform, or level, copper layers in electronic devices.

The trend of portability combined with increased functionality of electronic devices has driven the miniaturization of PCBs. Conventional multilayer PCBs with through-hole interconnects are not always a practical solution. Alternative approaches for high density interconnects have been developed, such as sequential build up technologies, which utilize blind vias. One of the objectives in processes that use blind vias is the maximizing of via filling while minimizing thickness variation in the copper deposit between the vias and the substrate surface. This is particularly challenging when the PCB contains both through-holes and blind vias.

Leveling agents are used in copper plating baths to level the deposit across the substrate surface and to improve the throwing power of the electroplating bath. Throwing power is defined as the ratio of the through-hole center copper deposit thickness to its thickness at the surface. Newer PCBs are being manufactured that contain both through-holes and blind vias. Current bath additives, in particular current leveling agents, do not always provide level copper deposits between the substrate surface and filled through-holes and blind vias. Via fill is characterized by the difference in height between the copper in the filled via and the surface. Accordingly, there remains a need in the art for leveling agents for use in metal electroplating baths for the manufacture of PCBs that provide level copper deposits while bolstering the throwing power of the bath.

SUMMARY OF THE INVENTION

A reaction product of one or more amine monomers and one or more polymers, where the polymers are composed of a reaction product of two or more monomers having a formula:

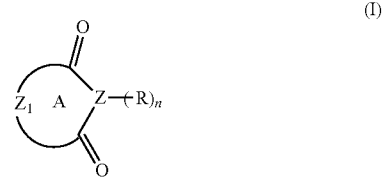

(I)

where A is a saturated 5 or 6 membered heterocyclic ring composed of 4 or 5 carbon atoms, the carbon atoms of the ring not part of the carbonyl moiety are independently substituted or unsubstituted; Z is a nitrogen atom or an oxygen atom and $Z_1$ is a carbon atom or an oxygen atom with the proviso that when Z is oxygen A is a 6 membered ring and $Z_1$ is a carbon atom, and when $Z_1$ is oxygen A is a 6 membered ring and Z is nitrogen; and R is a substituent group including hydrogen, linear or branched alkyl, linear or branched hydroxyalkyl, linear or branched haloalkyl, linear or branched aminoalkyl, linear or branched vinylalkyl or —$CH_2$—O—($R'$—O)$_d$—$CH_2$—Y where R' is a linear or branched ($C_2$-$C_{10}$)alkyl, Y is hydroxyl or halogen and d is an integer of 1-10 and n is 0 or 1 with the proviso that when n is 0, Z is an oxygen atom.

A composition including one or more sources of metal ions, an electrolyte and one or more compounds of a reaction product of one or more amine monomers and one or more polymers, where the polymers are composed of a reaction product of two or more monomers having a formula:

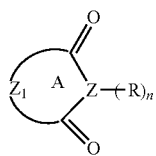

(I)

where A is a saturated 5 or 6 membered heterocyclic ring composed of 4 or 5 carbon atoms, the carbon atoms of the ring not part of the carbonyl moiety are independently substituted or unsubstituted; Z is a nitrogen atom or an oxygen atom and $Z_1$ is a carbon atom or an oxygen atom with the proviso that when Z is oxygen A is a 6 membered ring and $Z_1$ is a carbon atom, and when $Z_1$ is oxygen A is a 6 membered ring and Z is nitrogen; and R is a substituent group including hydrogen, linear or branched alkyl, linear or branched hydroxyalkyl, linear or branched haloalkyl, linear or branched aminoalkyl, linear or branched vinylalkyl or —$CH_2$—O—(R'—O)$_d$—$CH_2$—Y where R' is a linear or branched ($C_2$-$C_{10}$)alkyl, Y is hydroxyl or halogen and d is an integer of 1-10 and n is 0 or 1 with the proviso that when n is 0, Z is an oxygen atom.

A method including: providing a substrate; providing a composition comprising one or more sources of metal ions, an electrolyte and one or more compounds of a reaction product of one or more amine monomers and one or more polymers, wherein the polymers are composed of a reaction product of two or more monomers having a formula:

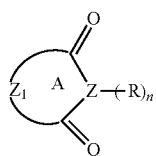

(I)

where A is a saturated 5 or 6 membered heterocyclic ring composed of 4 or 5 carbon atoms, the carbon atoms of the ring not part of the carbonyl moiety are independently substituted or unsubstituted; Z is a nitrogen atom or an oxygen atom and $Z_1$ is a carbon atom or an oxygen atom with the proviso that when Z is oxygen A is a 6 membered ring and $Z_1$ is a carbon atom, and when $Z_1$ is oxygen A is a 6 membered ring and Z is nitrogen; and R is a substituent group including hydrogen, linear or branched alkyl, linear or branched hydroxyalkyl, linear or branched haloalkyl, linear or branched aminoalkyl, linear or branched vinylalkyl or —$CH_2$—O—(R'—O)$_d$—$CH_2$—Y where R' is a linear or branched ($C_2$-$C_{10}$)alkyl, Y is hydroxyl or halogen and d is an integer of 1-10 and n is 0 or 1 with the proviso that when n is 0, Z is an oxygen atom.

The reaction products may be included in metal electroplating baths to provide metal layers having a substantially level surface across a substrate, even on substrates having small features and on substrates having a variety of feature sizes. The plating methods effectively deposit metals on substrates and in blind vias and through-holes such that the metal plating compositions have good throwing power.

DETAILED DESCRIPTION OF THE INVENTION

As used throughout this specification the following abbreviations shall have the following meanings unless the context clearly indicates otherwise: A=amperes; A/$dm^2$=amperes per square decimeter=ASD; ° C.=degrees Centigrade; g=gram; mg=milligrams, L=liter; ppm=parts per million=mg/L; μm=micron=micrometer; mm=millimeters; cm=centimeters; DI=deionized; mL=milliliter; mol=moles; mmoles=millimoles; Mw=weight average molecular weight; and Mn=number average molecular weight. All numerical ranges are inclusive and combinable in any order, except where it is clear that such numerical ranges are constrained to add up to 100%.

As used throughout the specification, "feature" refers to the geometries on a substrate. "Aperture" refers to recessed features including through-holes and blind vias. As used throughout this specification, the term "plating" refers to metal electroplating. "Deposition" and "plating" are used interchangeably throughout this specification. "Leveler" refers to an organic compound or salt thereof that is capable of providing a substantially level or planar metal layer. The terms "leveler" and "leveling agent" are used interchangeably throughout this specification. "Accelerator" refers to an organic additive that increases the plating rate of the electroplating bath (may be synonymous with brightener). "Suppressor" refers to an organic additive that suppresses the plating rate of a metal during electroplating. The term "amine monomer" within the scope of the invention is an organic nitrogen compound which includes at least one primary or secondary amine functionality and is not a polymer. The term "polymer" refers to a compound of two or more monomers which may be the same or different and includes dimers. The term "copolymer" refers to a polymer of two or more dissimilar monomers. The term "homopolymer" refers to a polymer of two or more of the same monomers. The terms "printed circuit boards" and "printed wiring boards" are used interchangeably throughout this specification. The term "moiety" means a part of a molecule or polymer that may include either whole functional groups or parts of functional groups as substructures. The terms "moiety" and "group" are used interchangeably throughout the specification. The "----" dashed line in chemical structures means an optional double bond. The articles "a" and "an" refer to the singular and the plural.

The compounds are copolymers of reaction products of one or more amines and one or more polymers, where the polymers may be copolymers or homopolymers and are composed of a reaction product of two or more monomers including an imide or anhydride functionality in a saturated ring, such monomers are those having a formula:

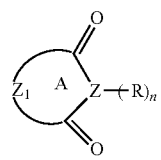

(I)

where A is a saturated 5 or 6 membered heterocyclic ring composed of 4 or 5 carbon atoms, the carbon atoms of the ring not part of the carbonyl moiety are independently substituted or unsubstituted; Z is a nitrogen atom or an oxygen atom and $Z_1$ is a carbon atom or an oxygen atom with the proviso that when Z is oxygen A is a 6 membered ring and $Z_1$ is a carbon atom, and when $Z_1$ is oxygen A is a 6 membered ring and Z is nitrogen; and R is a substituent group including but not limited to hydrogen, linear or branched alkyl such as $(C_1-C_5)$alkyl, linear or branched hydroxyalkyl such as hydroxy$(C_1-C_5)$alkyl, linear or branched haloalkyl such as halo$(C_1-C_5)$oalkyl where the halogen is chlorine, fluorine, bromine or iodine, linear or branched aminoalkyl such as amino$(C_1-C_5)$alkyl, linear or branched vinylalkyl such as $(C_1-C_5)$vinylalkyl, or —CH$_2$—O—(R'—O)$_d$—CH$_2$—Y where R' is a linear or branched $(C_2-C_{10})$alkyl, Y is hydroxyl or halogen where the halogen is chlorine, fluorine, bromine or iodine and d is an integer of 1-10 and n is 0 or 1 with the proviso that when n is 0, Z is an oxygen atom.

Substituent groups on the carbons of the ring include, but are not limited to linear or branched $(C_1-C_5)$alkyl, hydroxyl, linear or branched hydroxy$(C_1-C_5)$alkyl, linear or branched carboxy$(C_1-C_5)$alkyl, linear or branched $(C_1-C_5)$alkoxy, linear or branched halo$(C_1-C_5)$alkyl, aryl, linear or branched arylalkyl, and linear or branched, aminoalkyl.

Preferably, the monomers are those which include an imide functionality in the saturated ring having a formula:

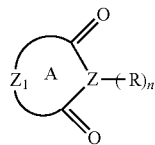

(II)

where R, n and $Z_1$ are as defined above. Preferably, $Z_1$ is a carbon atom and ring A is a 5 membered ring.

The monomers including the imide or anhydride functionality in the saturated ring may be reacted together by conventional polymerization methods known in the art such as condensation reactions or addition reactions. Preferably, monomers including the imide functionality are reacted with each other and monomers including the anhydride functionality are reacted with each other. The polymers formed may be copolymers or homopolymers. Such polymers also include dimers. A number of the polymers are commercially available such as polysuccimide and bismaleimide.

Preferred polymers include those having the following formulae:

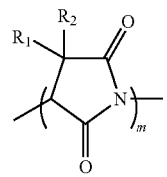

(III)

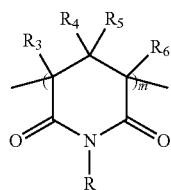

(IV)

where $R_1$ and $R_2$ may be the same or different and $R_3$, $R_4$, $R_5$ and $R_6$ may be the same or different and include, hydrogen, linear or branched $(C_1-C_5)$alkyl, hydroxyl, linear or branched hydroxy$(C_1-C_5)$alkyl, linear or branched carboxy$(C_1-C_5)$alkyl, linear or branched $(C_1-C_5)$alkoxy, linear or branched halo$(C_1-C_5)$alkyl, aryl, linear or branched ary-lalkyl, and linear or branched, aminoalkyl and m is an integer of 2 and greater, preferably 2 to 12, more preferably 2 to 8. Preferably, $R_1$, $R_2$, $R_3$, $R_4$, $R_5$ and $R_6$ are independently chosen from hydrogen and $(C_1-C_3)$alkyl, more preferably $R_1$, $R_2$, $R_3$, $R_4$, $R_5$ and $R_6$ are hydrogen. Preferably the polymer has structure (III) and is a polysuccimide.

Dimers may have the following general formulae:

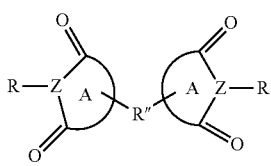

(V)

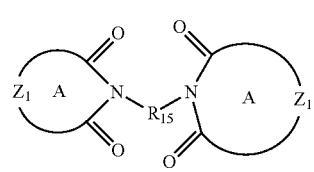

(VI)

where A, Z, $Z_1$ and R are as defined above and R" is $R_{10}$ or $R_{15}$ as defined below.

Preferred dimers include those having the following formulae:

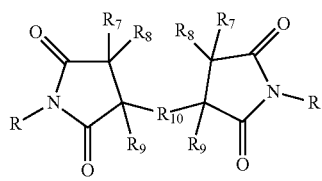

(VII)

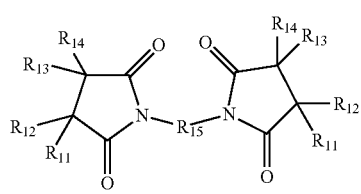

(VIII)

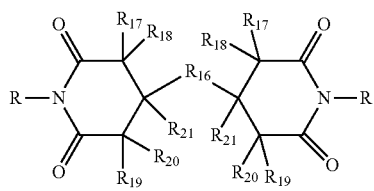

(IX)

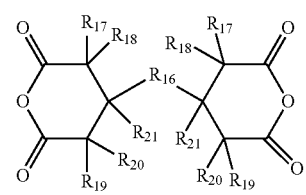

(X)

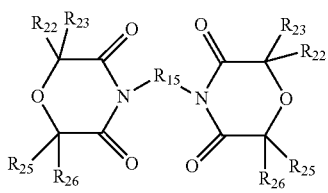

(XI)

wherein $R_{11}$-$R_{14}$, $R_{17}$-$R_{23}$ and $R_{25}$-$R_{26}$ are independently hydrogen, linear or branched $(C_1$-$C_5)$alkyl, hydroxyl, linear or branched hydroxy$(C_1$-$C_5)$alkyl, linear or branched carboxy$(C_1$-$C_5)$alkyl, linear or branched $(C_1$-$C_5)$alkoxy, linear or branched halo$(C_1$-$C_5)$alkyl, aryl, linear or branched arylalkyl, and linear or branched, aminoalkyl; $R_{15}$ is a moiety chosen from —$CH_2$—O—($R'$—O)$_d$—$CH_2$— where R' and d are as defined above or a moiety having formula:

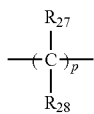

(XII)

where $R_{27}$ and $R_{28}$ are independently hydrogen or $(C_1$-$C_3)$ alkyl, p is an integer of 1 to 10, and $R_{16}$ has a moiety of formula (XII).

Amine monomers include organic nitrogen compounds which have at least one primary or secondary amine functionality which reacts with the polymer including an imide or anhydride functionality to form a polymer reaction product. Such amines include those having formulae:

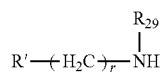

(XIII)

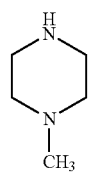

(XIV)

where $R_{29}$ is hydrogen or linear or branched $(C_1$-$C_5)$alkyl, r is an integer of 0 to 8 with the proviso that when r is 0, R' is joined to the nitrogen atom by a covalent bond. Preferably $R_{29}$ is hydrogen. Preferably r is 1-4.

R' is a nitrogen containing moiety which may be linear or branched nitrogen containing groups, aromatic or non-aromatic heterocyclic groups. Linear or branched nitrogen containing moieties include, but are not limited to those having a general formula:

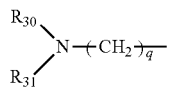

(XV)

where $R_{30}$ and $R_{31}$ are independently hydrogen or linear or branched $(C_1$-$C_5)$alkyl and q is an integer of 1-10, preferably from 1 to 4.

Heterocyclic aromatic and non-aromatic nitrogen containing moieties include but are not limited to those derived from heterocyclic nitrogen compounds such as imidazoles, triazoles, tetrazoles, pyrazines, benzimidazoles, benzotriazoles, purines, piperazines, pyridazines, pyrazoles, triazines, tetrazines, pyrimidines, piperidines, benzoxazoles, oxazoles, pyridines, morpholines, pyrrolidines, pyrroles, quinolines, isoquinolines and benzothiazoles. The heterocyclic nitrogen moieties may have one or more substituent groups joined to the rings. Such substituent groups include, but are not limited to, linear or branched, substituted or unsubstituted alkyl, hydroxyl, nitro or nitroalkyl, nitroso or nitrosoalkyl, carbonyl, mercapto or mercaptoalkyl, linear or branched hydroxyalkyl, carboxyl, linear or branched carboxyalkyl, linear or branched alkoxy, substituted or unsubstituted aryl, linear or branched, substituted or unsubstituted arylalkyl, linear or branched, substituted or unsubstituted aminoalkyl, substituted or unsubstituted sulfonyl, linear or branched, substituted or unsubstituted amine. Also included are salts of the aromatic heterocyclic amines such as halogen salts.

Heterocyclic nitrogen moieties may have the following general structure:

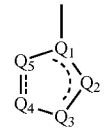

(XVI)

where $Q_1$ may be carbon or nitrogen and $Q_2$-$Q_4$ may be nitrogen, oxygen, carbon, or sulfur with the proviso that only one of the $Q_2$-$Q_5$ may be oxygen or sulfur at any instance. Preferably, the ring has one to three nitrogen atoms, more preferably one or two nitrogen atoms. Most preferably, the ring is an imidazole. The nitrogen which joins the ring to a terminal carbon of formula (XIII) above may have a positive charge where a counter anion is X" where X" is chloride, bromide, iodide, acetate, sulfate, hydroxyl, boron tetrafluoride or nitrate. The carbon atoms and nitrogen atoms may be substituted or unsubstituted. Substituents on carbon atoms and nitrogen atoms include but are not limited to, linear or branched, substituted or unsubstituted $(C_1$-$C_{10})$alkyl; hydroxyl; linear or branched alkoxy; linear or branched, substituted or unsubstituted hydroxy$(C_1$-$C_{10})$alkyl; linear or branched, substituted or unsubstituted alkoxy$(C_1$-$C_{10})$alkyl; linear or branched, substituted or unsubstituted carboxy$(C_1$-$C_{10})$alkyl; linear or branched, substituted or unsubstituted amino$(C_1$-$C_{10})$alkyl; substituted or unsubstituted aryl; linear or branched, substituted or unsubstituted aryl$(C_1$-$C_{10})$alkyl; substituted or unsubstituted sulfonyl; and substituted or unsubstituted amine.

Aromatic heterocyclic nitrogen moieties having fused rings may have the following general structure:

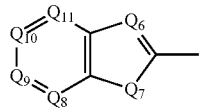

(XVI)

where $Q_6$-$Q_{11}$ may be carbon, oxygen, nitrogen or sulfur with the proviso that at least one of $Q_6$ and $Q_7$ is nitrogen and $Q_8$-$Q_{11}$ may be carbon or nitrogen atoms with the proviso that only two of $Q_8$-$Q_{11}$ may be nitrogen at the same instance. The carbon and nitrogen atoms of the rings may be substituted or unsubstituted. Substituents include but are not limited to, hydroxyl; linear or branched alkoxy; linear or branched, substituted or unsubstituted hydroxy($C_1$-$C_{10}$)alkyl; linear or branched, substituted or unsubstituted alkoxy ($C_1$-$C_{10}$)alkyl; linear or branched, substituted or unsubstituted carboxy($C_1$-$C_{10}$)alkyl; linear or branched, substituted or unsubstituted amino($C_1$-$C_{10}$)alkyl; substituted or unsubstituted aryl; linear or branched, substituted or unsubstituted aryl($C_1$-$C_{10}$)alkyl; substituted or unsubstituted sulfonyl; and substituted or unsubstituted amine. Such moieties are derived from compounds which include, but are not limited to, benzimidazoles, benzotriazoles, benzoxazoles, benzothiazoles, and purines. Preferably, such compounds are benzimidazoles.

Heterocyclic nitrogen moieties also include those having a general structure:

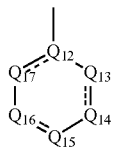
(XVII)

where $Q_{12}$ may be carbon or nitrogen and $Q_{13}$-$Q_{17}$ may be nitrogen, carbon or oxygen with the proviso that at least one of $Q_{12}$-$Q_{17}$ is nitrogen and there are no more than four nitrogen atoms in the ring. The carbon atoms and nitrogen atoms in the ring may be substituted or unsubstituted. Substituent groups may be the same or different and include, but are not limited to, those substituent groups described for $Q_1$-$Q_{11}$, above. When $Q_{12}$ is nitrogen, the nitrogen may have a positive charge where a counter anion is X" and X" is as defined above. When oxygen is present in the ring, only one of $Q_{13}$-$Q_{17}$ is oxygen at any instance. Heterocyclic nitrogen compounds of structure (XVII) may be aromatic or non-aromatic heterocyclic nitrogen compounds.

Preferred aromatic heterocyclic nitrogen containing R' moieties include those having the following formulae:

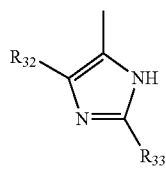
(XIV)

where $R_{32}$ and $R_{33}$ are independently hydrogen, ($C_1$-$C_2$) alkyl or phenyl;

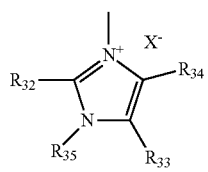
(XV)

where $R_{32}$, $R_{33}$, $R_{34}$ and $R_{35}$ are independently hydrogen, ($C_1$-$C_2$)alkyl or phenyl and X" is as defined above;

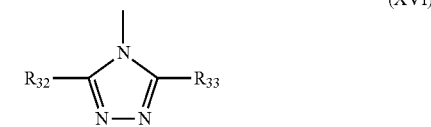
(XVI)

where $R_{32}$ and $R_{33}$ are as defined above;

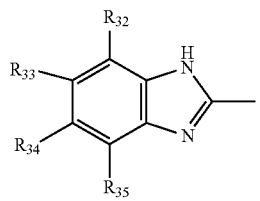
(XVII)

where $R_{32}$, $R_{33}$, $R_{34}$ and $R_{35}$ are as defined above;

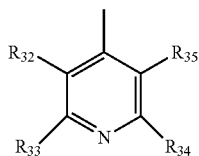
(XVIII)

where $R_{32}$, $R_{33}$, $R_{34}$ and $R_{35}$ are as defined above;

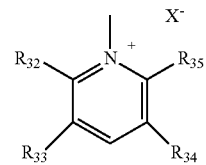
(XIX)

where $R_{32}$, $R_{33}$, $R_{34}$, $R_{35}$ and X⁻ are as defined above; and

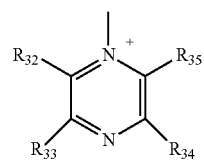
(XX)

where $R_{32}$, $R_{33}$, $R_{34}$, $R_{35}$ and X⁻ are as defined above;

Preferred moieties also include the following:

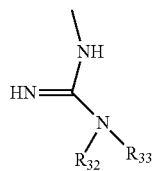

(XXI)

where $R_{32}$ and $R_{33}$, are as defined above; and

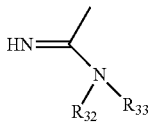

(XXII)

where $R_{32}$ and $R_{33}$, are as defined above.

The order of addition of reactants to a reaction vessel may vary, however, preferably, one or more polymers are mixed with dimethylformamide (DMF) at room temperature with dropwise addition of one or more amine monomers over 0.25 to 1 hour. This is done under a nitrogen atmosphere. The mixture is stirred 10-15 hours at room temperature. The amounts for each component may vary but, in general, sufficient amounts of each reactant are added to provide a product where the molar ratio of polymer to amine monomer ranges from 1:0.05 to 1:2, preferably 1:0.1 to 1:1, based on the molar ratio of the reactants.

The plating compositions and methods which include one or more of the reaction products are useful in providing a substantially level plated metal layer on a substrate, such as a printed circuit board or semiconductor chip. Also, the plating compositions and methods are useful in filling apertures in a substrate with metal. The metal deposits have good throwing power and good physical reliability in response to thermal shock stress tests.

Any substrate upon which metal can be electroplated may be used as a substrate with the metal plating compositions containing the reaction products. Such substrates include, but are not limited to: printed wiring boards, integrated circuits, semiconductor packages, lead frames and interconnects. An integrated circuit substrate may be a wafer used in a dual damascene manufacturing process. Such substrates typically contain a number of features, particularly apertures, having a variety of sizes. Through-holes in a PCB may have a variety of diameters, such as from 50 μm to 350 μm in diameter. Such through-holes may vary in depth, such as from 0.8 mm to 10 mm. PCBs may contain blind vias having a wide variety of sizes, such as up to 200 μm diameter and 150 μm depth, or greater. The plating compositions may also be used to electroplate on plastic materials which include conductive polymers or metal seed layers.

The metal plating compositions contain a source of metal ions, an electrolyte, and a leveling agent, where the leveling agent is a reaction product of one or more amine monomers and one or more polymers containing an imide or anhydride functionality. The metal plating compositions may contain a source of halide ions, an accelerator and a suppressor. Metals which may be electroplated from the compositions include, but are not limited to, copper, tin and tin/copper alloys. Preferably the metal plated is copper.

Suitable copper ion sources are copper salts and include without limitation: copper sulfate; copper halides such as copper chloride; copper acetate; copper nitrate; copper tetrafluoroborate; copper alkylsulfonates; copper aryl sulfonates; copper sulfamate; copper perchlorate and copper gluconate. Exemplary copper alkane sulfonates include copper $(C_1-C_6)$alkane sulfonate and more preferably copper $(C_1-C_3)$alkane sulfonate. Preferred copper alkane sulfonates are copper methanesulfonate, copper ethanesulfonate and copper propanesulfonate. Exemplary copper arylsulfonates include, without limitation, copper benzenesulfonate and copper p-toluenesulfonate. Mixtures of copper ion sources may be used. One or more salts of metal ions other than copper ions may be added to the present electroplating baths. Typically, the copper salt is present in an amount sufficient to provide an amount of copper metal of 10 to 400 g/L of plating solution.

Suitable tin compounds include, but are not limited to salts, such as tin halides, tin sulfates, tin alkane sulfonate such as tin methane sulfonate, tin aryl sulfonate such as tin benzenesulfonate and tin p-toluenesulfonate. The amount of tin compound in these electrolyte compositions is typically an amount that provides a tin content in the range of 5 to 150 g/L. Mixtures of tin compounds may be used in an amount as described above.

The electrolyte useful in the present invention may be alkaline or acidic. Preferably the electrolyte is acidic. Preferably, the pH of the electrolyte is ≤2. Suitable acidic electrolytes include, but are not limited to, sulfuric acid, acetic acid, fluoroboric acid, alkanesulfonic acids such as methanesulfonic acid, ethanesulfonic acid, propanesulfonic acid and trifluoromethane sulfonic acid, aryl sulfonic acids such as benzenesulfonic acid, p-toluenesulfonic acid, sulfamic acid, hydrochloric acid, hydrobromic acid, perchloric acid, nitric acid, chromic acid and phosphoric acid. Mixtures of acids may be advantageously used in the present metal plating baths. Preferred acids include sulfuric acid, methanesulfonic acid, ethanesulfonic acid, propanesulfonic acid, hydrochloric acid and mixtures thereof. The acids may be present in an amount in the range of 1 to 400 g/L. Electrolytes are generally commercially available from a variety of sources and may be used without further purification.

Such electrolytes may optionally contain a source of halide ions. Typically chloride ions are used. Exemplary chloride ion sources include copper chloride, tin chloride, sodium chloride, potassium chloride and hydrochloric acid. A wide range of halide ion concentrations may be used in the present invention. Typically, the halide ion concentration is in the range of 0 to 100 ppm based on the plating bath. Such halide ion sources are generally commercially available and may be used without further purification.

The plating compositions typically contain an accelerator. Any accelerators (also referred to as brightening agents) are suitable for use in the present invention. Such accelerators are well-known to those skilled in the art. Accelerators include, but are not limited to, N,N-dimethyl-dithiocarbamic acid-(3-sulfopropyl)ester; 3-mercapto-propylsulfonic acid-(3-sulfopropyl)ester; 3-mercapto-propylsulfonic acid sodium salt; carbonic acid, dithio-O-ethylester-S-ester with 3-mercapto-1-propane sulfonic acid potassium salt; bis-sulfopropyl disulfide; bis-(sodium sulfopropyl)-disulfide; 3-(benzothiazolyl-S-thio)propyl sulfonic acid sodium salt; pyridinium propyl sulfobetaine; 1-sodium-3-mercaptopropane-1-sulfonate; N,N-dimethyl-dithiocarbamic acid-(3-sulfoethyl)ester; 3-mercapto-ethyl propylsulfonic acid-(3-sulfoethyl)ester; 3-mercapto-ethylsulfonic acid sodium salt; carbonic acid-dithio-O-ethylester-S-ester with 3-mercapto- 1-ethane sulfonic acid potassium salt; bis-sulfoethyl disulfide; 3-(benzothiazolyl-S-thio)ethyl sulfonic acid sodium salt; pyridinium ethyl sulfobetaine; and 1-sodium-3-mercaptoethane-1-sulfonate. Accelerators may be used in a variety of amounts. In general, accelerators are used in an amount in a range of 0.1 ppm to 1000 ppm.

Any compound capable of suppressing the metal plating rate may be used as a suppressor in the present electroplating compositions. Suitable suppressors include, but are not limited to, polypropylene glycol copolymers and polyethylene glycol copolymers, including ethylene oxide-propylene oxide ("EO/PO") copolymers and butyl alcohol-ethylene oxide-propylene oxide copolymers. Suitable butyl alcohol-ethylene oxide-propylene oxide copolymers are those having a weight average molecular weight of 100 to 100,000, preferably 500 to 10,000. When such suppressors are used, they are typically present in an amount in the range of 1 to 10,000 ppm based on the weight of the composition, and more typically from 5 to 10,000 ppm. The leveling agents of the present invention may also possess functionality capable of acting as suppressors.

In general, the reaction products have a number average molecular weight (Mn) of 200 to 100,000, typically from 300 to 50,000, preferably from 500 to 30,000, although reaction products having other Mn values may be used. Such reaction products may have a weight average molecular weight (Mw) value in the range of 1000 to 50,000, typically from 5000 to 30,000, although other Mw values may be used.

The amount of the reaction product (leveling agent) used in the metal electroplating compositions depends upon the particular leveling agents selected, the concentration of the metal ions in the electroplating composition, the particular electrolyte used, the concentration of the electrolyte and the current density applied. In general, the total amount of the leveling agent in the electroplating composition ranges from 0.01 ppm to 500 ppm, preferably from 0.1 ppm to 250 ppm, most preferably from 0.5 ppm to 100 ppm, based on the total weight of the plating composition, although greater or lesser amounts may be used.

The electroplating compositions may be prepared by combining the components in any order. It is preferred that the inorganic components such as source of metal ions, water, electrolyte and optional halide ion source are first added to the bath vessel, followed by the organic components such as leveling agent, accelerator, suppressor, and any other organic component.

The electroplating compositions may optionally contain at least one additional leveling agent. Such additional leveling agents may be another leveling agent of the present invention, or alternatively, may be any conventional leveling agent. Suitable conventional leveling agents that can be used in combination with the present leveling agents include, without limitations, those disclosed in U.S. Pat. No. 6,610,192 to Step et al., U.S. Pat. No. 7,128,822 to Wang et al., U.S. Pat. No. 7,374,652 to Hayashi et al. and U.S. Pat. No. 6,800,188 to Hagiwara et al. Such combination of leveling agents may be used to tailor the characteristics of the plating bath, including leveling ability and throwing power.

Typically, the plating compositions may be used at any temperature from 10 to 65° C. or higher. Preferably, the temperature of the plating composition is from 10 to 35° C. and more preferably from 15 to 30° C.

In general, the metal electroplating compositions are agitated during use. Any suitable agitation method may be used and such methods are well-known in the art. Suitable agitation methods include, but are not limited to: air sparging, work piece agitation, and impingement.

Typically, a substrate is electroplated by contacting the substrate with the plating composition. The substrate typically functions as the cathode. The plating composition contains an anode, which may be soluble or insoluble. Potential is typically applied to the electrodes. Sufficient current density is applied and plating performed for a period of time sufficient to deposit a metal layer having a desired thickness on the substrate as well as to fill blind vias, trenches and through-holes, or to conformally plate through-holes. Current densities may range from 0.05 to 10 A/dm$^2$, although higher and lower current densities may be used. The specific current density depends in part upon the substrate to be plated, the composition of the plating bath, and the desired surface metal thickness. Such current density choice is within the abilities of those skilled in the art.

An advantage of the present invention is that substantially level metal deposits are obtained on a PCB. Through-holes, blind vias or combinations thereof in the PCB are substantially filled or through-holes are conformally plated with desirable throwing power. A further advantage of the present invention is that a wide range of apertures and aperture sizes may be filled or conformally plated with desirable throwing power.

Throwing power is defined as the ratio of the average thickness of the metal plated in the center of a through-hole compared to the average thickness of the metal plated at the surface of the PCB sample and is reported as a percentage. The higher the throwing power, the better the plating composition is able to conformally plate the through-hole.

The compounds provide metal layers having a substantially level surface across a substrate, even on substrates having small features and on substrates having a variety of feature sizes. The plating methods effectively deposit metals in through-holes such that the metal plating compositions have good throwing power.

While the methods of the present invention have been generally described with reference to printed circuit board manufacture, it is appreciated that the present invention may be useful in any electrolytic process where an essentially level or planar metal deposit and filled or conformally plated apertures are desired. Such processes include, but are not limited to, semiconductor packaging and interconnect manufacture.

The following examples are intended to further illustrate the invention but are not intended to limit its scope.

Example 1

Polysuccimide (2.4 g, 24.7 mmoles) and 20 mL dimethylformamide (DMF) were added to a three necked flask round bottomed flask. Aminopropyl imidazole (3.24 g, 25.9 mmoles) in 5 mL DMF was added dropwise over a period of 0.5 hours with stirring under a nitrogen atmosphere. The mixture was stirred at room temperature for 12 hours. Then the solvent was evaporated and the product was washed with acetone to remove residue of DMF and any unreacted aminopropyl imidazole. The molecular weights of the unpurified product were determined to be Mn=4594 and Mw=9206.

Three aqueous acid copper electroplating baths were prepared as shown in Table 1 below. The reaction product was included in the baths without purification.

TABLE 1

| COMPNENT | BATH 1 | BATH 2 | BATH 3 |
| --- | --- | --- | --- |
| Purified copper sulfate pentahydrate | 73 g/L | 73 g/L | 73 g/L |
| Sulfuric acid | 235 g/L | 235 g/L | 235 g/L |
| Chloride ions as hydrogen chloride | 60 ppm | 60 ppm | 60 ppm |
| Reaction product of polysuccinamide and aminopropyl imidazole (leveler) | 0 ppm | 10 ppm | 20 ppm |
| bis(sodium-sulfopropyl)disulfide | 3 ppm | 3 ppm | 3 ppm |
| EO/PO copolymer with a molecular weight of <5000 and terminal hydroxyl groups | 1.5 g/L | 1.5 g/L | 1.5 g/L |

Test panels 3.2 mm thick with average through-hole diameters of 300 μm were immersed in the three aqueous acid copper electroplating baths. Copper plating was done for 80 minutes at 25° C. The current density was 2.16 ASD. The copper plated samples were analyzed to determine the throwing power ("TP") of the plating bath, and percent cracking according to the following methods.

Throwing power was calculated by determining the ratio of the average thickness of the metal plated in the center of a through-hole compared to the average thickness of the metal plated at the surface of the test panel. The throwing power is reported in Table 2 as a percentage.

The percent cracking was determined according to the industry standard procedure, IPC-TM-650-2.6.8. Thermal Stress, Plated-Through Holes, published by IPC (Northbrook, Ill., USA), dated May, 2004, revision E.

TABLE 2

| Leveler (ppm) | Hole thickness (μm) | Surface thickness (μm) | TP % | Cracking ratio |
| --- | --- | --- | --- | --- |
| 0 | 12.6 | 27.5 | 45.8 | 0 |
| 10 | 16.2 | 25.7 | 63.0 | 0 |
| 20 | 17.9 | 26.6 | 67.3 | 0 |

The average surface thickness of the copper plated on the panels was substantially the same for each sample. Through-hole thickness was improved in the two baths which included the leveler. Improved throwing power was also observed in the copper plating baths which included the reaction product over the bath which excluded it. All of the samples tested had good cracking results. The lower the percentage of cracking, the better was the plating performance. Preferably, cracking was ≤10%.

Example 2

The copper electroplating process described above was repeated using the same reaction product in each bath but the amount varied. In addition, the amount of brightener added to the copper baths was either 1 ppm or 3 ppm as shown in the table below. The electroplating conditions were the same as in Example 1 as well as the type of substrates plated. The results are shown in Table 3.

TABLE 3

| Sample | Leveler (ppm) | Brightener (ppm) | Hole thickness (μm) | Surface thickness (μm) | TP % | Cracking % | Appearance |
| --- | --- | --- | --- | --- | --- | --- | --- |
| 1 | 1 | 1 | 10.1 | 25.3 | 4.0 | 0 | bright |
| 2 | 2 | 1 | 14.3 | 26.3 | 54.4 | 0 | bright |
| 3 | 5 | 1 | 14.8 | 25.33 | 58.0 | 0 | bright |
| 4 | 10 | 1 | 14.55 | 26.3 | 55.3 | 0 | bright |
| 5 | 20 | 1 | 13.4 | 26.8 | 50.0 | 0 | bright |
| 6 | 5 | 3 | 15.8 | 27.1 | 58.3 | 0 | bright |
| 7 | 10 | 3 | 16.2 | 25.7 | 63.0 | 0 | bright |
| 8 | 20 | 3 | 17.9 | 26.6 | 67.3 | 0 | bright |
| 9 | 50 | 3 | 15.8 | 27.2 | 58.1 | 0 | bright |

All of the deposits were bright and smooth in appearance. Throwing power was good overall with the best results achieved in samples 6 and 7 at leveler concentrations of 10 ppm and 20 ppm. No cracking was observed. This was consistent with the results in Example 1 above.

Example 3

To a three necked round-bottom flask 25 mmoles of polysuccimide and 20 mL dimethylformamide (DMF) were added. Then 26 mmoles of an amine having formula:

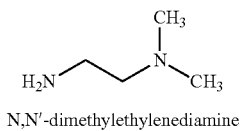

N,N'-dimethylethylenediamine in 5 mL DMF was added dropwise over a period of 0.5 hours with stirring under a nitrogen atmosphere. The mixture was stirred at room temperature for 12 hours. Then the solvent was evaporated and the product was washed with acetone to remove any residue.

Three aqueous acid copper electroplating baths were prepared having the formulation disclosed in Table 1 of Example 1 except the amount of brightener was 1 ppm. The reaction product was included in the baths without purification. The amount of reaction product or leveler was used in amounts as shown in Table 4 below.

TABLE 4

| Sample | Leveler (ppm) | Brightener (ppm) | Hole thickness (μm) | Surface thickness (μm) | TP % | Cracking % | Appearance |
| --- | --- | --- | --- | --- | --- | --- | --- |
| 1 | 5 | 1 | 8.95 | 25.6 | 35 | 0 | bright |
| 2 | 10 | 1 | 13.8 | 26.4 | 52.3 | 0 | bright |
| 3 | 20 | 1 | 12.5 | 23.6 | 53 | 50 | matte |

Acceptable throwing power values were obtained for samples 2 and 3; however, sample 3 had a high cracking ratio and the deposit was matte.

Example 4

To a three necked round-bottom flask 25 mmoles of polysuccimide and 20 mL dimethylformamide (DMF) were added. 25 mmoles of an amine having formula:

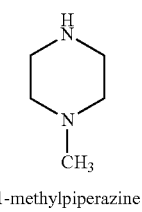

1-methylpiperazine in 5 mL DMF was then added dropwise over a period of 0.5 hours with stirring under a nitrogen atmosphere. The mixture was stirred at room temperature for 12 hours. Then the solvent was evaporated and the product was washed with acetone to remove any residue.

An aqueous acid copper electroplating bath was prepared having the formulation disclosed in Table 1 of Example 1 except the amount of brightener was 1 ppm. The reaction product was included in the baths without purification. The amount of reaction product or leveler was used in the amount as shown in Table 5 below. Plating was done as described in Example 1 above using the same type of panel.

TABLE 5

| Sample | Leveler (ppm) | Brightener (ppm) | Hole thickness (μm) | Surface thickness (μm) | TP % | Cracking % | Appearance |
|---|---|---|---|---|---|---|---|
| 1 | 50 | 1 | 13.35 | 27.5 | 48.5 | 0 | bright |

The copper deposit was bright and the throwing power was an acceptable value. No cracking was observed.

Example 5

To a three necked round-bottom flask 25 mmoles of polysuccimide and 20 mL dimethylformamide (DMF) were added. 25 mmoles of an amine having formula:

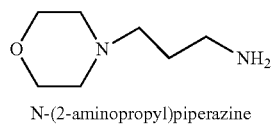

N-(2-aminopropyl)piperazine in 5 mL DMF was then added dropwise over a period of 0.5 hours with stirring under a nitrogen atmosphere. The mixture was stirred at room temperature for 12 hours. Then the solvent was evaporated and the product was washed with acetone to remove any residue.

Three aqueous acid copper electroplating baths were prepared having the formulation disclosed in Table 1 of Example 1 except the amount of brightener was 1 ppm. The reaction product was included in the baths without purification. The amount of reaction product or leveler was used in the amount as shown in Table 6 below. Plating was done as described in Example 1 above using the same type of panel.

TABLE 6

| Sample | Leveler (ppm) | Brightener (ppm) | Hole thickness (μm) | Surface thickness (μm) | TP % | Cracking % | Appearance |
|---|---|---|---|---|---|---|---|
| 1 | 5 | 1 | 16.5 | 27.2 | 60.7 | 0 | bright |
| 2 | 10 | 1 | 14.5 | 26.5 | 55 | 0 | bright |
| 3 | 20 | 1 | 14.16 | 26.7 | 53 | 0 | bright |

All of the samples showed good throwing power and all have bright deposits. No cracking was observed on any of the deposits.

Example 6

To a three necked round-bottom flask 25 mmoles of polysuccimide and 20 mL dimethylformamide (DMF) were added. 25 mmoles of an amine having formula:

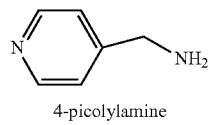

4-picolylamine in 5 mL DMF was then added dropwise over a period of 0.5 hours with stirring under a nitrogen atmosphere. The mixture was stirred at room temperature for 12 hours. Then the solvent was evaporated and the product was washed with acetone to remove any residue.

Six aqueous acid copper electroplating baths were prepared having the formulation disclosed in Table 1 of Example 1. The amount of brightener in the baths was either 1 ppm or 3 ppm. The reaction product was included in the baths without purification. The amount of reaction product or leveler was used in the amount as shown in Table 7 below. Plating was done as described in Example 1 above using the same type of panels.

TABLE 7

| Sample | Leveler (ppm) | Brightener (ppm) | Hole thickness (μm) | Surface thickness (μm) | TP % | Cracking % | Appearance |
|---|---|---|---|---|---|---|---|
| 1 | 1 | 1 | 14.55 | 26.9 | 54.1 | 80 | bright |
| 2 | 5 | 1 | 16.5 | 25.2 | 65.4 | 100 | matte |
| 3 | 5 | 3 | 17.0 | 27.1 | 62.7 | 0 | bright |
| 4 | 10 | 3 | 18.3 | 25.6 | 71.5 | 80 | bright |
| 5 | 20 | 3 | 18.4 | 27.7 | 66.4 | 0 | bright |
| 6 | 50 | 3 | 18.3 | 28.6 | 64.0 | 0 | bright |

Overall throwing power was very good; however, cracking was a problem in half of the samples analyzed. Deposits were bright over all.

Example 7

To a three necked round-bottom flask 25 mmoles of polysuccimide and 20 mL dimethylformamide (DMF) were added. 25 mmoles of an amine having formula:

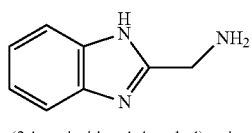

(2-benzimidazolylmethyl)amine in 5 mL DMF was then added dropwise over a period of 0.5 hours with stirring under a nitrogen atmosphere. The mixture was stirred at room temperature for 12 hours. Then the solvent was evaporated and the product was washed with acetone to remove any residue.

Six aqueous acid copper electroplating baths were prepared having the formulation disclosed in Table 1 of Example 1. The amount of brightener in the baths was 1 ppm, 2 ppm or 3 ppm. The reaction product was included in the baths without purification. The amount of reaction product or leveler was used in the amount as shown in Table 8 below. Plating was done as described in Example 1 above using the same type of panels.

TABLE 8

| Sample | Leveler (ppm) | Brightener (ppm) | Hole thickness (μm) | Surface thickness (μm) | TP % | Cracking % | Appearance |
|---|---|---|---|---|---|---|---|
| 1 | 5 | 1 | 14.9 | 26.6 | 56 | 100 | bright |
| 2 | 10 | 1 | 14.3 | 26.1 | 54.8 | 100 | matte |
| 3 | 5 | 3 | 16.2 | 24.7 | 65.6 | 100 | bright |
| 4 | 10 | 3 | 15.6 | 24 | 62.5 | 100 | bright |
| 5 | 1 | 1 | 16.3 | 25.4 | 64.2 | 100 | bright |
| 6 | 1 | 2 | 17 | 27.5 | 61.8 | 20 | bright |

All of the samples had good throwing power, however, cracking was prevalent.

Example 8

To a three necked round-bottom flask 25 mmoles of polysuccimide and 20 mL dimethylformamide (DMF) were added to a three necked flask. 25 mmoles of an amine having formula:

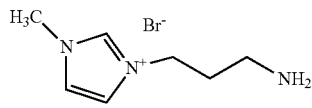

1-methyl-3-(2-aminopropyl)imidazolium hydrobromide in 5 mL DMF was added dropwise over a period of 0.5 hours with stirring under a nitrogen atmosphere. The mixture was stirred at room temperature for 12 hours. Then the solvent was evaporated and the product was washed with acetone to remove any residue.

Three aqueous acid copper electroplating baths were prepared having the formulation disclosed in Table 1 of Example 1. The amount of brightener in the baths was 1 ppm or 3 ppm. The reaction product was included in the baths without purification. The amount of reaction product or leveler was used in the amount as shown in Table 9 below. Plating was done as described in Example 1 above using the same type of panels.

TABLE 9

| Sample | Leveler (ppm) | Brightener (ppm) | Hole thickness (μm) | Surface thickness (μm) | TP % | Cracking % | Appearance |
|---|---|---|---|---|---|---|---|
| 1 | 1 | 3 | 15.9 | 29 | 54.8 | 0 | bright |
| 2 | 1 | 1 | 17.5 | 27 | 64.8 | 60 | bright |
| 3 | 0.5 | 1 | 16.7 | 26.9 | 62.1 | 0 | bright |

Throwing power was good for all of the baths. Significant cracking was observed in only sample 2. No cracking was observed in samples 1 and 3. All deposits were bright.

Example 9

To a three necked round-bottom 25 mmoles of polysuccimide and 20 mL dimethylformamide (DMF) were added. 25 mmoles of an amine having formula:

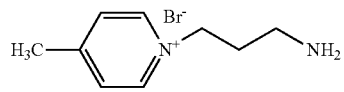

(2-aminopropyl)-4-methyl pyridinium hydrobromide in 5 mL DMF was then added dropwise over a period of 0.5 hours with stirring under a nitrogen atmosphere. The mixture was stirred at room temperature for 12 hours. Then the solvent was evaporated and the product was washed with acetone to remove any residue.

Three aqueous acid copper electroplating baths were prepared having the formulation disclosed in Table 1 of Example 1. The amount of brightener in the baths was 1 ppm or 3 ppm. The reaction product was included in the baths without purification. The amount of reaction product or leveler was used in the amount as shown in Table 10 below. Plating was done as described in Example 1 above using the same type of panels.

TABLE 10

| Sample | Leveler (ppm) | Brightener (ppm) | Hole thickness (μm) | Surface thickness (μm) | TP % | Cracking % | Appearance |
|---|---|---|---|---|---|---|---|
| 1 | 1 | 1 | 12.5 | 26.6 | 47 | 100 | bright |
| 2 | 1 | 3 | 18 | 27 | 66.7 | 0 | bright |
| 3 | 5 | 3 | 14 | 26.6 | 53.8 | 100 | bright |

Throwing power was good for samples 2 and 3. However, significant cracking was observed in samples 1 and 3. All deposits were bright.

Example 10

To a three necked round-bottom flask 25 mmoles of polysuccimide and 20 mL dimethylformamide (DMF) were added. 25 mmoles of an amine having formula:

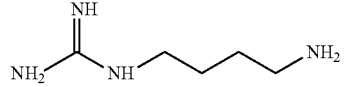

N-(3-aminobutyl) guanidine in 5 mL DMF was then added dropwise over a period of 0.5 hours with stirring under a nitrogen atmosphere. The mixture was stirred at room temperature for 12 hours. Then the solvent was evaporated and the product was washed with acetone to remove any residue.

Three aqueous acid copper electroplating baths were prepared having the formulation disclosed in Table 1 of Example 1. The amount of brightener in the baths was 1 ppm, 2 ppm or 3 ppm. The reaction product was included in the baths without purification. The amount of reaction product or leveler was used in the amount as shown in Table 11 below. Plating was done as described in Example 1 above using the same type of panels.

TABLE 11

| Sample | Leveler (ppm) | Brightener (ppm) | Hole thickness (μm) | Surface thickness (μm) | TP % | Cracking % | Appearance |
|---|---|---|---|---|---|---|---|
| 1 | 0.5 | 1 | 13.3 | 24.5 | 54.3 | 30 | matte |
| 2 | 0.5 | 2 | 16.8 | 26.3 | 63.8 | 72.5 | matte |
| 3 | 0.5 | 3 | 15.8 | 23.7 | 66.7 | 22.5 | matte |
| 4 | 0.25 | 3 | 12.5 | 27.3 | 45.8 | 32.5 | matte |

With the exception of sample 4, the throwing power was good, however, cracking was significant. Deposit appearances were matte.

What is claimed is:

1. A reaction product of one or more amine monomers and one or more polymers, the one or more polymers have the formula:

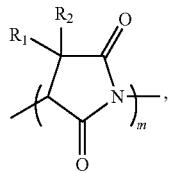

(III)

where $R_1$ and $R_2$ can be the same or different and comprise hydrogen, linear or branched $(C_1$-$C_5)$alkyl, hydroxyl, linear or branched $(C_1$-$C_5)$hydroxyalkyl, linear or branched $(C_1$-$C_5)$carboxyalkyl, linear or branched $(C_1$-$C_5)$alkoxy, linear or branched $(C_1$-$C_5)$haloalkyl, aryl, linear or branched arylalkyl, or linear or branched, aminoalkyl and m is an integer of 2-8.

2. The reaction product of claim 1, wherein the one or more amine monomers are chosen from compounds having formula:

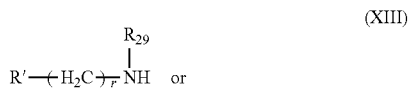

(XIII)

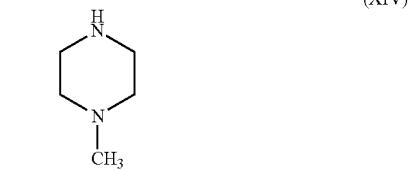

(XIV)

where $R_{29}$ is hydrogen or linear or branched $(C_1$-$C_5)$alkyl, r is an integer of 0 to 8 with the proviso that when r is 0, R' is joined to the nitrogen atom by a covalent bond and R' is a linear or branched nitrogen containing moiety, aromatic or non-aromatic heterocyclic groups.

* * * * *